United States Patent [19]
Scifres et al.

[11] Patent Number: 5,103,456
[45] Date of Patent: Apr. 7, 1992

[54] BROAD BEAM LASER DIODE WITH INTEGRATED AMPLIFIER

[75] Inventors: Donald R. Scifres; David F. Welch, both of San Jose, Calif.; William Streifer, deceased, late of Palo Alto, Calif., by Shirley R. Streifer, executrix

[73] Assignee: Spectra Diode Laboratories, Inc., San Jose, Calif.

[21] Appl. No.: 559,648

[22] Filed: Jul. 30, 1990

[51] Int. Cl.⁵ .............................................. H01S 3/19
[52] U.S. Cl. ...................................... 372/50; 372/49; 372/102; 372/99; 372/96
[58] Field of Search .................... 372/50, 49, 102, 96, 372/99

[56] References Cited
U.S. PATENT DOCUMENTS
5,003,550 3/1991 Welch et al. ........................... 372/50

Primary Examiner—Léon Scott, Jr.
Attorney, Agent, or Firm—Schneck & McHugh

[57] ABSTRACT

An integrated master oscillator/power amplifier semiconduction device having a laser diode oscillator, a broad area light amplifier and a coupling grating disposed to deflect light at an angle from the laser oscillator to the light amplifier. The amplifier may terminate as an output facet or use a grating surface emitter to couple amplified light out of the device. The orientation angle and grating period of the coupling grating are chosen to minimize feedback from the amplifier into the laser. This is achieved either by deflecting the light by other than a 90° angle or by orienting the grating at other than 45° with respect to laser even though light is deflected by 90° so that any return light effectively "sees" a different grating. The laser can be a DFB or DBR laser and can be wavelength tunable.

60 Claims, 4 Drawing Sheets

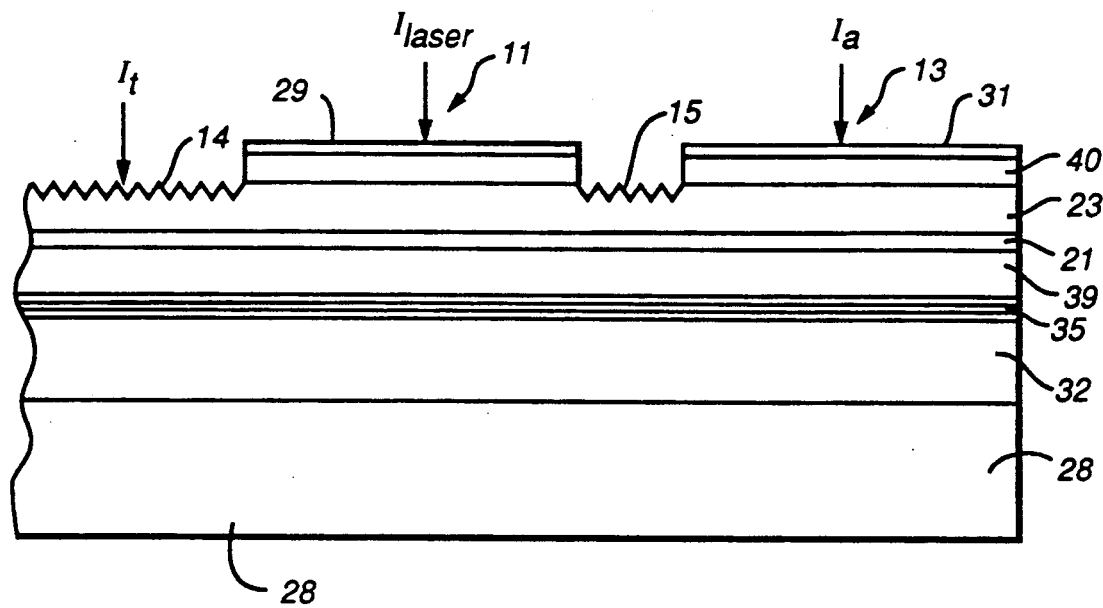
FIG._1
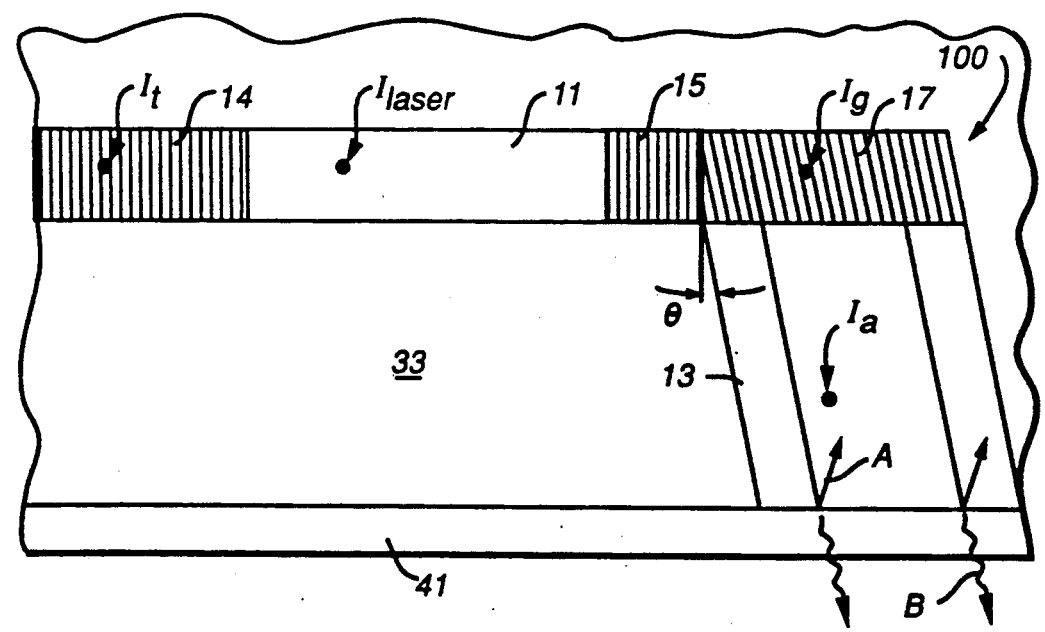
FIG._2

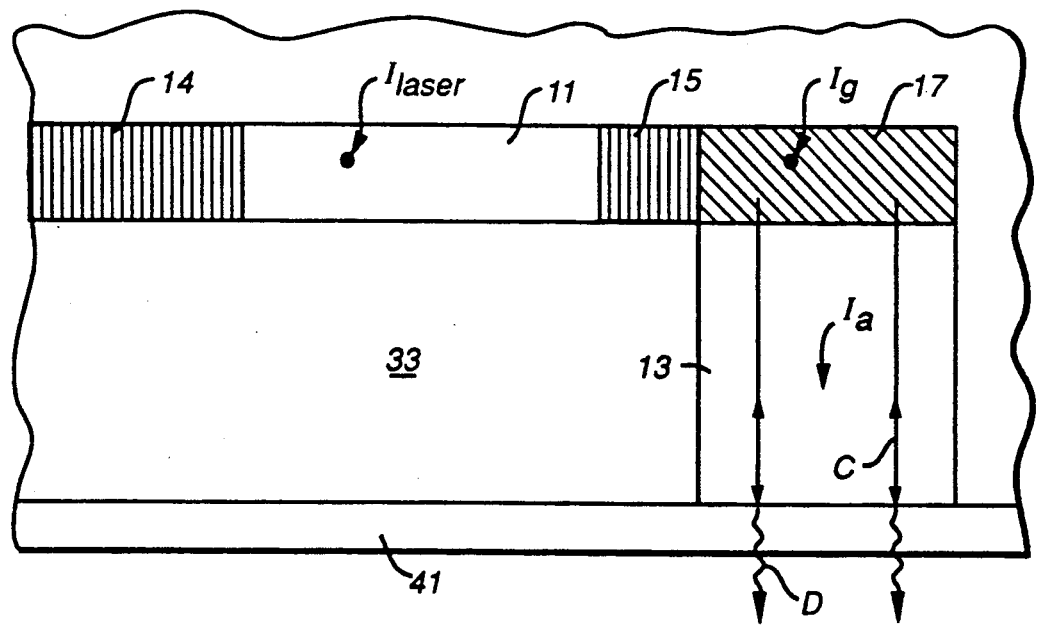
FIG._3
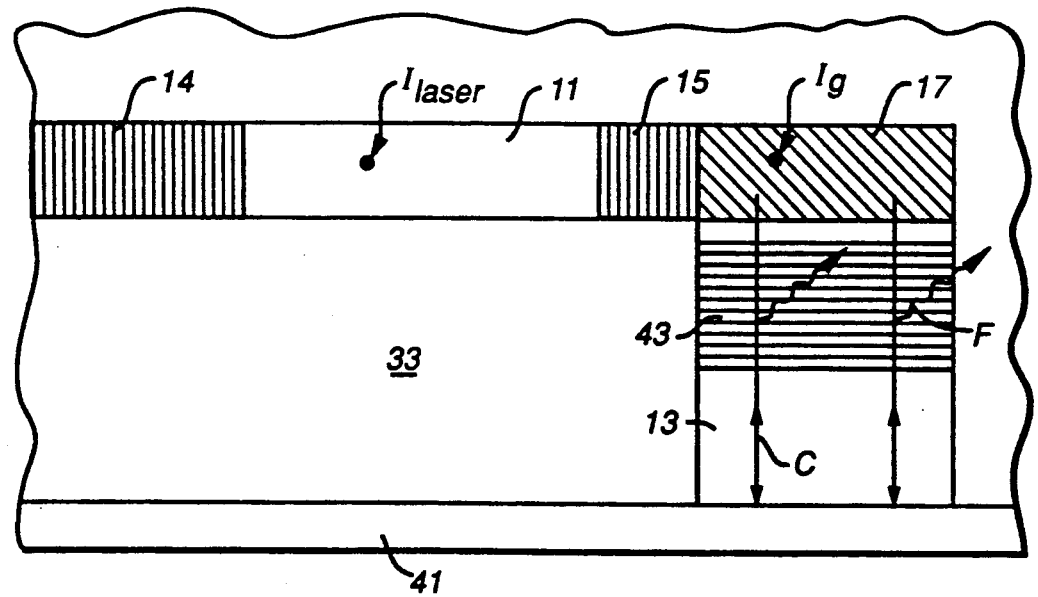
FIG._5

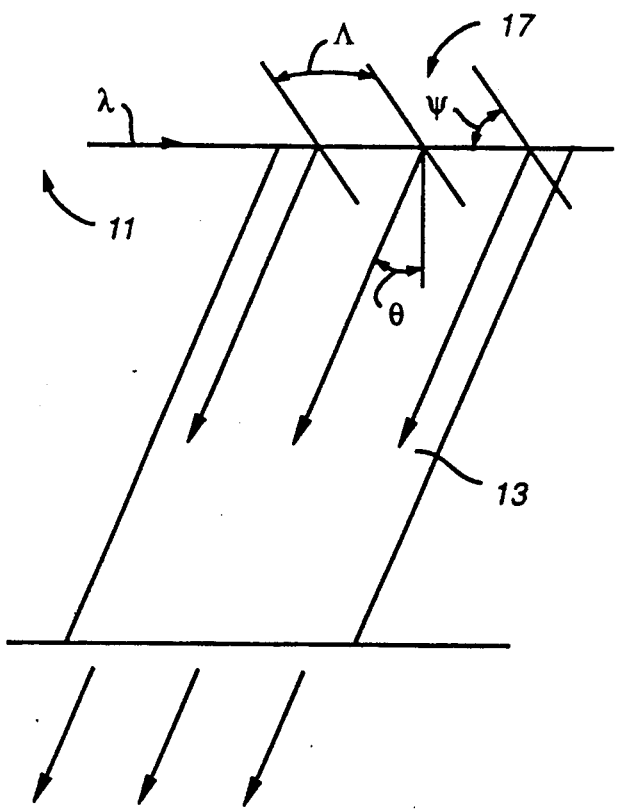
FIG._4
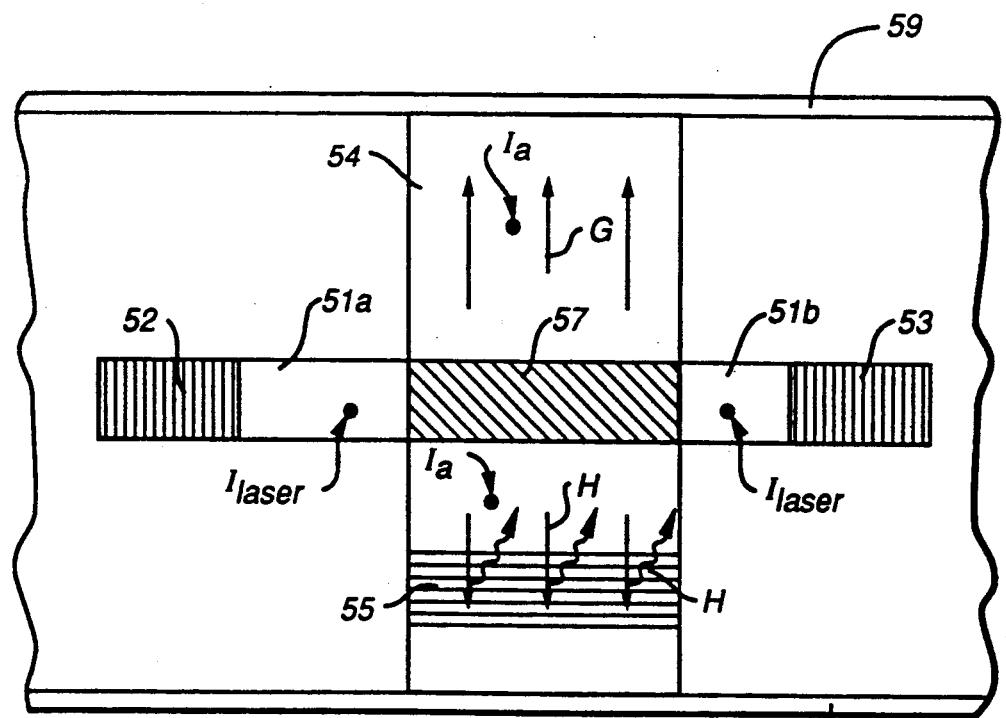
FIG._6

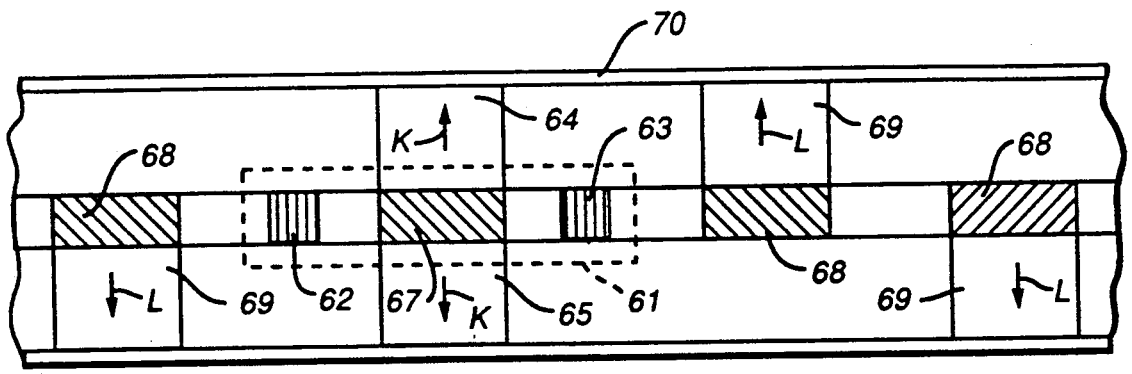
FIG._7
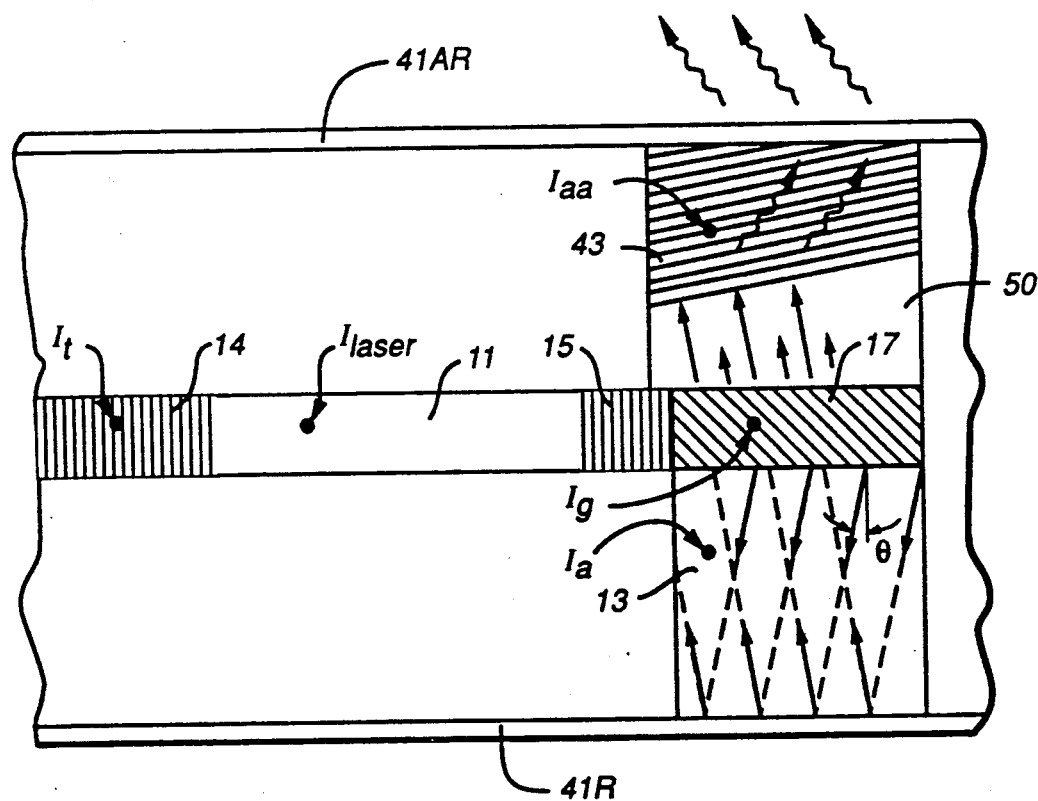
FIG._8

BROAD BEAM LASER DIODE WITH INTEGRATED AMPLIFIER

TECHNICAL FIELD

The present invention relates to high power semiconductor diode laser configurations, and in particular to a diode laser oscillator element monolithically integrated with an optical power amplifier element.

BACKGROUND ART

Semiconductor diode lasers are useful for a wide variety of applications, such as fiberoptic communications and optical data retrieval. Some potential applications, such as optical space communications, optical recording, semiconductor processing, spectrum analysis, laser radar, range finding and contour mapping, require high power, single spectral and spatial mode optical sources. Unfortunately, presently available diode laser configurations have difficulty in achieving both high power and a diffraction limited single mode beam in a single device. Diffraction limited single mode lasers are commercially available with an output power of 100 mW cw.

The master oscillator power amplifier (MOPA) system is one structure that has been studied as having the potential to provide both high power and a diffraction limited single mode output. A MOPA with discrete oscillator and amplifier elements is described by Bradford et al. in U.S. Pat. No. 4,713,821. The MOPA includes a semiconductor laser diode having an output facet optically coupled to an optical power amplifier. The diode and amplifier are formed together as a single integral crystal, then cleaved to form a crack or division between the two. The diode and amplifier remain essentially a single unit in optical alignment with only a slight longitudinal shift resulting from the cleave. The active region at the entrance to the amplifier has the same lateral dimension as the active region at the exit of the laser diode, and the lateral dimension increases linearly in the forward direction toward the exit facet. The exit facet of the amplifier is antireflection coated.

In practice, MOPA structures with discrete elements are difficult to make, because the laser and amplifier must be mounted in precise alignment with close tolerances in order to achieve optical coupling. Further, even when alignment is achieved there are still substantial coupling losses to the amplifier because of the reflectivity of the entrance facet of the amplifier. Also, residual reflections of the amplifier excite self-oscillation in the amplifier, quenching the gain that is intended to be used by the laser output. As a result, a 100 mW cw diffraction limited output is the maximum limit.

In U.S. Pat. No. 4,744,089 to Montroll et al., an improved MOPA structure is described which requires no cleaving into separate elements, and is therefore monolithic. A laser diode has a periodic grating providing distributed feedback. A power amplifier with a diverging active area follows the laser, and the amplifier output facet is made antireflecting. The laser and amplifier are formed with separate electrical contacts so they can be driven by independent current sources. A power output of 1 W cw is achieved.

Feedback from the amplifier output facet must be minimized to allow the amplifier to be operated at high gain without parasitic oscillation deteriorating the spectral coherence of the device. In the MOPA structures described above, this is accomplished with an antireflection coating on the output facet. Unfortunately, a reflectivity below 0.001 is required and a reflectivity on the order of 0.0001 is preferred. Such low reflectivities are only achieved with difficulty with high quality dielectric coatings.

It is an object of the present invention to provide a monolithic master oscillator power amplifier (MOPA) structure which achieves both high power and diffraction limited, single spatial and spectral mode output beam.

DISCLOSURE OF THE INVENTION

The above object has been met with an integrated master oscillator power amplifier laser device having a grating with characteristics for coupling light from the waveguide of a laser oscillator into a broad area amplifier that is laterally disposed relative to the oscillator waveguide. By proper choice of the grating characteristics, such as the grating angle and period relative to the oscillator waveguide, and of the angle of the amplifier relative to the oscillator waveguide, feedback from the output facet of the amplifier can be kept from quenching the amplifier gain and deteriorating the coherence achieved by the master oscillator. The grating couples light unidirectionally, that is from the laser oscillator to the amplifier, but not from the amplifier back into the oscillator.

The semiconductor diode laser includes an active region for lightwave generation, a vertical waveguide structure for propagation of the lightwaves and reflectors for providing feedback of the lightwaves. A lateral index guide or gain guide is also provided. The laser's active region is electrically pumped with an injected current to generate the lightwaves. The laser waveguide and reflector structure is preferably capable of supporting propagation of only a single spatial and longitudinal mode. One or both of the laser reflectors may be distributed Bragg reflectors. Alternatively, a DFB reflector, one or more etched facet reflectors, one or more cleaved reflectors or any combination of the above, as well as other integrated reflector technologies may be used. A grating is disposed to deflect some light out of the laser for amplification. Enough light should remain to sustain lasing, but otherwise as much light as possible is deflected out of the laser. Alternatively, the grating to deflect light is present outside the laser cavity but is monolithically disposed on the chip. Light from the laser is then deflected by the grating into an amplifier section.

The amplifier is coupled to the laser by means of the grating which, in the preferred embodiment, deflects light at an angle other than 45° to the amplifier waveguide area. This requires that the power amplifier be laterally disposed relative to the waveguide, rather than in-line, as in the prior art. The amplifier extends over a broad area and so does not readily saturate. This allows realization of output power exceeding several watts. The amplifier is also pumped to provide an optical power gain to the lightwaves.

BRIEF DESCRIPTION OF THE DRAWINGS

FIG. 1 is a side sectional view of a master oscillator, power amplifier in accord with the present invention.

FIGS. 2, 3 and 5 are top views of three embodiments the master oscillator, power amplifier shown in FIG. 1.

FIG. 4 is a top schematic view of a grating coupler region of a master oscillator, power amplifier of the present invention, illustrating selection of grating period and grating orientation angle for a desired light deflection.

FIGS. 6, 7 and 8 are top views of three additional master oscillator, power amplifier embodiments of the present invention.

BEST MODE FOR CARRYING OUT THE INVENTION

With reference to FIGS. 1-3, an integrated master oscillator power amplifier (MOPA) of the present invention includes a single mode master oscillator 11, which may be made wavelength tunable, a set of first, second, or higher order gratings 14 and 15, serving as reflectors, and a power amplifier 13. An angled grating 17 couples light from the oscillator 11 to the power amplifier 13. The MOPA's elements 11, 13, 14, 15 and 17 are integrated on a common monolithic substrate 19. An active region 21 of one or more thin layers associated with a semiconductor p-n junction is disposed over the substrate 19. Amplifier 13 is disposed in lateral relation to master oscillator 11 and is optically coupled thereto by the angled grating 17.

The master oscillator 11 is a semiconductor diode laser having active region 21 for lightwave generation and electrical surface contact layer portions 29 and 31 for injecting current $I_{laser}$ and $I_a$, respectively into, and thereby pumping, the active region 21 to generate the lightwaves. Waveguide layers 23 and 39, each consisting of one or more layers proximate to the active region 21 support propagation of the lightwaves. The gratings 14 and 15 are a pair of distributed Bragg reflectors of first, second or higher order providing feedback of lightwaves along the waveguide 23. The lateral laser waveguide 11 is typically a real refractive index waveguide approximately 1-5 $\mu$m wide. Lateral waveguide 11 supports a single spatial mode at least to moderate power levels in the tens of milliwatts and preferably up to 100 mW. Alternatively, the lateral waveguide may be an array of lasers, a broad area laser, a phase locked or injection locked laser or laser array, a wavelength tunable laser or other lateral laser structure known in the art.

The vertical structure of the integrated laser/amplifier device can be that of any heterostructure laser device with an active region or regions, cladding layers for light guiding within the laser, and contact layers for electrical excitation. The construction of one type of integrated structure of the present invention is on an n-doped GaAs substrate 28, over which is an n-doped $Al_{0.6}Ga_{0.4}As$ layer 32. On top of layer 32 is cladding layer 39 composed of $Al_{0.4}Ga_{0.6}As$. The quantum well active region 21 is made of $Al_{0.1}Ga_{0.9}As$. Above the active region is a first upper layer 23 made of $Al_{0.2}Ga_{0.8}As$ immediately beneath a second upper layer 40 made of p-doped $Al_{0.6}Ga_{0.4}As$. The upper layer 23 in conjunction with active region 21 serves as a waveguide. Lastly, the layer contact portions 29 and 31 are made of p+ doped GaAs.

Lasers require that feedback be provided at each end of the pumped gain section. The distributed Bragg reflectors 14 and 15 at each end of the waveguide 23, having a center gain portion of which is pumped by current $I_{laser}$, provide the feedback in the preferred embodiment and permit the direct integration of amplifier 13 with laser 11 without reflection from the amplifier 13. Reflectors 14 and 15 may be either first order, second or higher order gratings. The most efficient feedback gratings are formed by matching the grating period to the first order Bragg condition of the laser light. For a GaAs active region 21, this requires a grating period on the order of 100 nm, which is somewhat difficult to fabricate. Easier and more reliable fabrication is obtained by using second order gratings. With second order gratings some of the light is coupled to radiation modes, which represent additional losses to the system, but if the losses in a particular embodiment are deemed to be significant a substrate reflector, such as a multilayer stack 35, can be added to recover some of the lost light.

Front grating 15 is relatively short to enhance transmission to the power amplifier. An effective reflectivity of 30% or less is preferred. Front grating 15 provides a relatively broad band reflection because of its short length. The rear grating 14 is relatively long to provide a high reflectivity. An effective reflectivity of 90% or more is preferred. Rear grating 14 because of its length provides a relatively narrow band reflection with strong frequency selectivity. The laser 11 thus is capable of supporting a single temporal mode to power levels up to at least 100 mW. The laser 11 can be tuned to select a specific frequency or wavelength by varying the amount of current $I_t$ injected into the device in the region of grating 14. An overgrowth layer or layers might be required above grating 14 to allow more efficient tuning current injection. Other wavelength tunable DFB and DBR lasers are known in the art and can also be integrated into this laser/amplifier structure. Such tunable lasers operate by injecting current into a grating region or depleting free carriers via a reverse bias voltage thereby changing the index of refraction in that region, temporarily changing the effective grating period, thus causing a shift in laser wavelength.

The power amplifier 13 consists of a gain or index-guided lateral waveguide, including the upper contact layer 31, which may be split to allow separate currents to pump the deflection grating 17 and the amplifier 13. These currents are labeled $I_g$ and $I_a$ respectively. The amplifier length is limited by gain saturation and by noise due to amplified spontaneous emission, which competes with the injected signal for gain. A typical amplifier waveguide of the present invention has a length of about 0.5-4 mm and a width of 1-10 mm. The deflection grating 17 receives a typical 25 mW input power from the oscillator 11. Current $I_g$ allows amplification of this light in the deflection grating region 17. Alternatively this region may be left unpumped. An approximately 20 dB small signal gain in the amplifier 13 may be obtained so that the expected output power from amplifier 13 is about 1200 mW-2,500 mW or greater.

Gain saturation can be minimized, as is well known, by use of multiple quantum wells or single quantum wells in the active region 21 of the amplifier 13. An output power increase might also be achieved by altering the guiding parameters of waveguide 23 to increase the mode width of the optical field and thereby reduce the intensity in the active region 21.

The angled grating region 17 in FIG. 2 may, if desired, contain a lateral waveguide as shown in FIG. 2 in order to better collimate the lasing output light as it traverses the grating. Region 17 may further be electrically pumped to reduce attenuation of the laser light before it is deflected into the amplifier region 13. Alternatively, the vertical waveguide in this region may be rendered transparent via impurity induced disordering or etch and regrowth techniques.

The angled gratings 17 in FIG. 2 are chosen to deflect light at an angle Θ relative to a line perpendicular to the optical axis of the oscillator waveguide. As shown in FIG. 4, this angle Θ is determined by the incident wavelength λ of lasing light, the effective refractive index $n_{eff}$ seen by this light in the angled grating region 17, the spacing Λ between angled grating teeth and the angle ψ of the grating relative to the light propagation direction. The required grating spacing Λ is $$\Lambda = \frac{p\lambda}{n_{eff}} \frac{\sin\psi}{1 + \sin\Theta}$$

where p is an integer.

The device can be further optimized by taking into account the effects of a blazed grating. That is, if the angle of incidence of light with respect to the grating grooves is approximately equal to the angle of deflection of light with respect to the grating grooves, a maximum amount of light will be deflected at the deflection angle. Analytically this can be expressed as $90° - \psi \approx \psi - \Theta$ or substituting in the above equation $$\Lambda = \frac{p\lambda}{2n_{eff}} \frac{1}{\sin\psi}$$

for maximum deflection into the amplifier. A range of ψ and Θ exist being dependent on the width of the laser beam incident on the angled grating. A range may be within 5°-15° of the maximum power deflection (blazed) angle.

Referring now to FIG. 2, the amplifier 33 has an output facet 41 which may be parallel to the laser oscillator waveguide axis. Accordingly, the angle of incidence onto the output facet is 90°-Θ. Some of the light striking the output facet is reflected in the amplifier section, in a direction indicated by the arrows A. Hence, this light cannot couple back into the oscillator even if it reaches the grating since the light will encounter a different grating period. Thus, the grating 17, being sensitive to the angle of incidence of light upon it, becomes a device for isolating the amplifier from the oscillator. Some of the light incident upon the output facet 41 penetrates the output facet, as indicated by lines B. Output facet 41 may be antireflection coated to maximize this output coupling.

Isolation can also be obtained even if amplified light strikes the output facet at normal incidence, as shown in FIG. 3. In this situation, some of the light, indicated by arrow C, will be reflected back toward the grating. However, if the grating is fabricated to have an angle other than 45° (ψ≠45°) to the axis of the oscillator waveguide, the grating period will be different for light entering the grating from the amplifier than for light entering the grating from the waveguide. Because of the different period, light will not be coupled back into the oscillator. Some of the light striking output facet 41 will be transmitted through the output facet, indicated by arrow D. Other grating configurations will perform the same function, such as a non-uniformly spaced (chirped) grating, or a curved grating. Angling of output facet 41 relative to laser 11 will also increase isolation.

The laser amplifier may be modulated by varying the current $I_a$, or by varying current into the output grating, $I_g$, or by varying the oscillator current $I_{laser}$. The oscillator and grating sections may be pumped with a different current. If $I_t$ is modulated, the index guided laser wavelength will shift, as previously discussed. The oscillator wavelength can also be modulated by temperature changes. Modulation of current $I_g$ will cause the beam angle Θ to be electronically steered.

With reference to FIG. 5, a device similar to that shown in FIG. 3 is seen in which the laser amplifier section 13 may also contain a grating output coupler 43 to deflect light F out of the surface of the chip. Feedback to the laser oscillator 11 is further minimized if a grating 43 not equal to a Bragg condition is utilized, although this is not a requirement owing to the selection of a coupling grating 17 wherein feedback to the laser oscillator is minimized.

With reference to FIG. 6, another device in accord with the present invention has a laser diode having gain regions 51a and 51b electrically pumped with injected current $I_{laser}$ and bounded by grating reflectors 52 and 53 forming a laser oscillator. Reflectors 52 and 53 preferably have high reflectivity. Light amplifiers 54 and 55 are laterally disposed relative to the laser axis established by the reflectors 52 and 53. Amplifiers 54 and 55 may be separately electrically pumped relative to the laser with an injected current $I_a$. A coupling grating 57 resides within the laser oscillator cavity along the laser axis between reflectors 52 and 53. Grating 57 is oriented, as in previous embodiments described above, at an angle such that light generated in the laser is deflected from the laser into the amplifiers 54 and 55, as indicated by arrows G. The amplified light G may be edge emitted through antireflection coatings 59 or, alternatively, may be surface emitted, as in FIG. 5, by means of a grating output coupler 55, as indicated by arrows H.

In FIG. 7, a device similar to that in FIG. 6 is seen having a laser diode 61 with partial reflectors 62 and 63 establishing a laser oscillator therebetween, amplifiers 64 and 65 laterally disposed with respect to the laser oscillator and a grating coupler 67 disposed at an angle to deflect some of the light in the laser oscillator cavity into the amplifiers 64 and 65, as indicated by arrows K. Grating 67 again resides within the oscillator cavity. Additional angled gratings 68 may also be disposed along the laser axis outside the oscillator cavity to the left and right of reflectors 62 and 63. These additional gratings 68 deflect light emitted from the laser 61 into other laterally disposed amplifier sections 69, as indicated by arrows L.

In FIG. 8, the angled grating region 17 is shown being utilized in conjunction with a double pass amplifier section 13, a high reflectivity mirror surface 41R and a grating output coupler region 43 or output coupling facet 41AR. As before, laser 11 produces light which deflects at an angle Θ from angled grating 17 into the double pass amplifier section 13. Section 13 is rendered to be a double pass amplifier owing to the high reflectivity coating 41R applied to the surface. Alternatively, significant reflectivity will occur by a simple cleaving process. The double pass amplifier section has the advantage that two plane waves going in opposite directions interfere with each other to produce an intensity modulation within the gain region. This intensity modulation serves to stabilize the amplifier and keep it from filamentary operation. An internal injection angle Θ ∼ 1.5° causes a gain modulation periodicity of 4.6 μm, based on the interference between the 2 beams in the double pass amplifier, specifically $$\sin\Theta = \frac{\lambda}{2n_{effa}\Lambda_a}$$

where $n_{effa}$ is the effective refractive index in the amplifier and $\Lambda_a$ (=4.6 μm) is the induced gain periodicity caused by the interfering beams. Other injection angles from on the order of 1° to 2° will induce the grating with a periodicity of approximately a filament size thereby stabilizing the amplifier.

Following amplification the beam passes into region 50. This region may be pumped with current $I_{aa}$ and act like a further stage of amplification. (If not pumped the region must at least not greatly attenuate the light).

After traversing this region 50 light would emerge from facet 41AR which may be anti-reflection coated or otherwise be at least partially light transmitting. Alternatively, grating output coupler 43 can be used to diffract the light from the surface of the crystal. For best output coupling the grating grooves should be made approximately perpendicular to the light propagation direction and the output coupling grating should be detuned to avoid feedback to the amplifier.

We claim:

1. An integrated master oscillator power amplifier laser device comprising,
    an index-guided or gain guided laser diode having an axis thereon and with reflection means and current injection means for forming a laser oscillator, said laser disposed on a substrate,
    one or more light amplifiers laterally disposed relative to the laser axis on said substrate, and
    one or more coupling gratings disposed on said substrate along said laser axis at an angle to the direction of light propagation such that light is deflected from the laser oscillator into the amplifier.

2. The device of claim 1 wherein the amplifier has an output facet generally parallel to the laser axis.

3. The device of claim 2 wherein the coupling grating is disposed at an angle or has a period such that light emerging from the laser oscillator is normally incident on said amplifier output facet.

4. The device of claim 2 wherein the coupling grating is disposed at an angle or has a period such that light emerging from the laser oscillator is incident on said amplifier output facet at an angle other than normally incident.

5. The device of claim 2 wherein said output facet has an anti-reflective coating.

6. The device of claim 1 wherein said reflection means comprises a DFB grating.

7. The device of claim 1 wherein said reflection means comprises etched reflectors.

8. The device of claim 1 wherein said reflection means comprise distributed Bragg reflectors.

9. The device of claim 8 wherein a wavelength tuning current is applied to one or both of said reflectors.

10. The device of claim 1 wherein said amplifier is a broad area amplifier.

11. The device of claim 1 wherein said amplifier is separately electrically pumped relative to said laser.

12. The device of claim 1 wherein said amplifier is separately electrically pumped relative to said coupling grating.

13. The device of claim 1 wherein said amplifier is separately electrically pumped relative to both said coupling grating and said laser.

14. The device of claim 1 wherein said laser is wavelength tuned.

15. The device of claim 1 wherein said coupling grating period is electronically tuned for steering said deflected beam.

16. The device of claim 1 wherein an output coupling grating deflects light from the surface of said amplifier.

17. The device of claim 16 which employs a reflector to above or below said amplifier to enhance said surface emission.

18. The device of claim 1 wherein light is emitted from an edge of said amplifier.

19. The device of claim 1 wherein the coupling grating angle ψ, the grating period Λ and the deflection angle Θ are defined by $90° - \psi \approx \psi - \Theta \pm 15°$ and $$\Lambda = \frac{p\lambda}{n_{eff}} \frac{\sin\psi}{1 + \sin\Theta}$$

where p is an integer, λ is the wavelength of light incident upon said coupling grating, and $n_{eff}$ is the effective refractive index for the incident light at said coupling grating.

20. The device of claim 1 wherein said coupling grating resides within said laser oscillator cavity.

21. The device of claim 20 wherein said amplifier or amplifiers are surface emitting amplifiers.

22. The device of claim 20 wherein said amplifiers are edge emitting.

23. The device of claim 20 wherein said laser and said amplifiers are separately electrically pumped.

24. The device of claim 20 wherein coupling gratings also lie outside said laser.

25. The device of claim 20 wherein the output beam is electronically deflected.

26. The device of claim 1 wherein said coupling grating regions are laterally index guided.

27. The device of claim 1 wherein the output beam is electronically deflected.

28. A master oscillator power amplifier device comprising,
    laser oscillator means disposed on a substrate for generating a beam in a waveguide,
    a broad area light amplifier laterally disposed relative to the waveguide on said substrate adjacent to the waveguide, and
    light deflecting grating means disposed at an angle to the direction of light propagation on said substrate along the waveguide for angularly and unidirectionally directing light from the waveguide into the amplifier.

29. The apparatus of claim 28 having means for injecting current into said laser.

30. The apparatus of claim 28 wherein the coupling grating angle ψ is chosen to maximize light deflection into the amplifier at angle Θ by being within ±15° of $$\psi = \frac{90° + \Theta}{2}.$$

31. The apparatus of claim 28 wherein said laser oscillator means includes spaced apart reflective gratings with current injection means for tuning said laser.

32. The apparatus of claim 28 wherein said light deflecting grating means comprises a plurality of parallel angled linear grooves in said waveguide.

33. The apparatus of claim 28 wherein said light amplifier has current injection means.

34. The apparatus of claim 28 wherein said light amplifier has an output facet with an anti-reflection coating generally parallel to the axis of the waveguide.

35. The apparatus of claim 34 wherein the light deflecting means comprises angled linear grooves disposed in relation to the waveguide in a manner deflecting light to be normally incident on said amplifier output facet.

36. The apparatus of claim 34 wherein the light deflecting means comprises angled linear grooves disposed in relation to the waveguide in a manner deflecting light at an angle other than normally incident on said amplifier output facet.

37. An integrated master oscillator power amplifier semiconductor device comprising,
a laser diode portion for lightwave generation and oscillation,
a light amplifier section, and
a coupling grating section disposed at an angle to the direction of light propagation to deflect light from said laser diode portion into said light amplifier section.

38. The device of claim 37 wherein said coupling grating section is characterized by a grating period chosen to deflect said light into said light amplifier section at other than a 90° angle, whereby feedback of said light to said laser diode portion is minimized.

39. The device of claim 37 wherein said coupling grating section has a grating period chosen to deflect said light into said light amplifier section at a 90° angle, said coupling grating section also having a grating orientation angle with respect to an axis of said laser diode portion which is other than 45°, whereby feedback of said light to said laser diode portion is minimized.

40. The device of claim 37 wherein said light amplifier section is a broad area amplifier.

41. The device of claim 37 wherein said laser diode portion is an index guided laser.

42. The device of claim 37 wherein said laser diode portion is a distributed feedback laser.

43. The device of claim 37 wherein said laser diode portion is a distributed Bragg reflector laser.

44. The device of claim 37 wherein said laser diode portion is a single mode laser.

45. The device of claim 37 wherein said laser diode portion is wavelength tunable.

46. The device of claim 37 wherein separate currents are applied to said laser diode portion and said light amplifier section.

47. The device of claim 37 wherein nonseparated currents are applied to said laser diode portion and said light amplifier section.

48. The device of claim 37 wherein said coupling grating section is a transparent waveguide region for low loss propagation.

49. The device of claim 37 wherein said coupling grating section is electrically pumped for low loss propagation.

50. The device of claim 37 wherein said coupling grating section is electrically pumped with sufficient current to provide light amplification.

51. The device of claim 37 wherein said light amplifier section terminates in an output facet through which amplified light emerges, said output facet being antireflection coated for the propagation angle of said amplified light in said light amplifier section.

52. The device of claim 37 wherein said light amplifier section contains a grating output coupler to deflect light out through a surface of the device.

53. An integrated master oscillator power amplifier laser device comprising,
an index-guided or gain guided laser diode having an axis thereon and with reflection means and current injection means for forming a laser oscillator, said laser disposed on a substrate,
one or more light amplifiers laterally disposed relative to the laser axis on said substrate, and
one or more coupling gratings disposed on said substrate along said laser axis at an angle to the direction of light propagation such that light is deflected from the laser oscillator into the amplifier, said amplifier having two interfering light beams propagating therein.

54. The device of claim 53 wherein the amplifier has a reflective facet generally parallel to the laser axis.

55. The device of claim 54 wherein the coupling grating is disposed at an angle or has a period such that light emerging from the laser oscillator is not normally incident on said reflective facet.

56. The device of claim 54 wherein the coupling grating is disposed at an angle or has a period such that light emerging from the laser oscillator is incident on one or more amplifiers, said reflective facet causing said interfering beams.

57. The device of claim 56 wherein at least one of said amplifiers has an output coupling grating.

58. The device of claim 56 wherein one of said amplifiers has a low reflectivity output coupling facet.

59. The device of claim 53 wherein said reflection means comprises a DFB grating.

60. The device of claim 53 wherein said reflection means comprises etched reflectors.

* * * * *